United States Patent
Park et al.

(10) Patent No.: US 8,860,109 B2
(45) Date of Patent: Oct. 14, 2014

(54) CAPACITOR-LESS MEMORY DEVICE

(75) Inventors: Jea-Gun Park, Gyeonggi-Do (KR); Tae-Hun Shim, Gyeonggi-Do (KR); Gon-Sub Lee, Seoul (KR); Seong-Je Kim, Gyeonggi-Do (KR); Tae-Hyun Kim, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 314 days.

(21) Appl. No.: 12/990,353

(22) PCT Filed: Apr. 30, 2009

(86) PCT No.: PCT/KR2009/002284
§ 371 (c)(1),
(2), (4) Date: Jan. 7, 2011

(87) PCT Pub. No.: WO2009/134089
PCT Pub. Date: Nov. 5, 2009

(65) Prior Publication Data
US 2011/0127580 A1 Jun. 2, 2011

(30) Foreign Application Priority Data

Apr. 30, 2008 (KR) ........................ 10-2008-0040888

(51) Int. Cl.
| | |
|---|---|
| *H01L 27/108* | (2006.01) |
| *H01L 29/78* | (2006.01) |
| *G11C 11/404* | (2006.01) |
| *H01L 29/423* | (2006.01) |
| *G11C 16/04* | (2006.01) |
| *H01L 29/786* | (2006.01) |

(52) U.S. Cl.
CPC ........ *H01L 29/4234* (2013.01); *G11C 16/0466* (2013.01); *H01L 29/7841* (2013.01); *G11C 11/404* (2013.01); *H01L 27/10802* (2013.01); *H01L 29/78687* (2013.01); *G11C 2211/4016* (2013.01); *H01L 29/78696* (2013.01)
USPC ..... 257/296; 257/300; 257/196; 257/E21.403

(58) Field of Classification Search
CPC ............ H01L 27/10802; H01L 27/108; H01L 29/7841
USPC ............. 257/192, 196, E21.403, 19, 296, 300
See application file for complete search history.

(56) References Cited

U.S. PATENT DOCUMENTS

| | | | | |
|---|---|---|---|---|
| 5,698,869 A | * | 12/1997 | Yoshimi et al. | ............... 257/192 |
| 6,774,390 B2 | * | 8/2004 | Sugiyama et al. | ............. 257/19 |

(Continued)

FOREIGN PATENT DOCUMENTS

| | | |
|---|---|---|
| JP | 2008-213624 | 8/1996 |
| JP | 2010-092952 | 4/1998 |

(Continued)

OTHER PUBLICATIONS

Virginia Semiconductor, The General Properties of Si,Ge, SiGe, SiO2 and Si3N4, 2002, Virginia Semiconductor, pp. 1-5.*

(Continued)

*Primary Examiner* — Jerome Jackson, Jr.
*Assistant Examiner* — Paul Budd
(74) *Attorney, Agent, or Firm* — Osha Liang LLP

(57) ABSTRACT

Provided is a capacitorless memory device. The device includes a semiconductor substrate, an insulating layer disposed on the semiconductor substrate, a storage region disposed on a partial region of the insulating layer, a channel region disposed on the storage region to provide a valence band energy offset between the channel region and the storage region, a gate insulating layer and a gate electrode sequentially disposed on the channel region, and source and drain regions connected to the channel region and disposed at both sides of the gate electrode. A storage region having different valence band energy from a channel region is disposed under the channel region unit so that charges trapped in the storage region unit cannot be easily drained. Thus, a charge retention time may be increased to improve data storage capability.

15 Claims, 14 Drawing Sheets

(56) References Cited

U.S. PATENT DOCUMENTS

| | | | |
|---|---|---|---|
| 2004/0256647 A1* | 12/2004 | Lee et al. | 257/289 |
| 2005/0062088 A1* | 3/2005 | Houston | 257/296 |
| 2005/0093021 A1 | 5/2005 | Ouyang et al. | |
| 2005/0218427 A1* | 10/2005 | Joshi et al. | 257/192 |
| 2005/0285097 A1 | 12/2005 | Shang et al. | |
| 2006/0125010 A1* | 6/2006 | Bhattacharyya | 257/347 |
| 2006/0157687 A1* | 7/2006 | Doyle et al. | 257/19 |
| 2006/0266996 A1* | 11/2006 | Irisawa et al. | 257/19 |
| 2007/0001222 A1 | 1/2007 | Orlowski et al. | |
| 2008/0237577 A1* | 10/2008 | Chui et al. | 257/24 |
| 2009/0108292 A1* | 4/2009 | Liu et al. | 257/190 |

FOREIGN PATENT DOCUMENTS

| | | |
|---|---|---|
| JP | 2003-243667 | 8/2003 |
| JP | 2006-339309 | 12/2006 |
| KR | 1019990036735 A | 5/1999 |
| KR | 1019990057821 A | 7/1999 |
| KR | 1020030011512 A | 2/2003 |
| KR | 1020030034470 A | 5/2003 |
| KR | 1020030081142 A | 10/2003 |
| WO | 2007093741 A2 | 8/2007 |
| WO | 2009055173 A2 | 4/2009 |

OTHER PUBLICATIONS

International Search Report w/translation from PCT/KR2009/002284 dated Dec. 14, 2009 (4 pages).

Korean Patent Abstracts; Publication No. 1020030081142A dated Oct. 17, 2003 (1 page).

Korean Patent Abstracts; Publication No. 1020030034470A dated May 9, 2003 (1 page).

Korean Patent Abstracts; Publication No. 1020030011512A dated Feb. 11, 2003 (1 page).

Korean Patent Abstracts; Publication No. 1999-0057821 dated Jul. 15, 1999 (1 page).

Korean Patent Abstracts; Publication No. 1019990036735A dated May 25, 1999 (1 page).

Extended European Search Report for application No. 9738995.1, dated Apr. 23, 2012 (10 pages).

English abstract for Japanese Patent Application Publication No. 2010-092952 (1 page).

English abstract for Japanese Patent Application Publication No. 2003-243667 (1 page).

English abstract for Japanese Patent Application Publication No. 2006-339309 (1 page).

English abstract for Japanese Patent Application Publication No. 2008-213624 (1 page).

* cited by examiner (a)　　　　　　　　　　　　(b)

(a)  (b)

CAPACITOR-LESS MEMORY DEVICE

TECHNICAL FIELD

The present invention relates to a capacitor-less memory device, and more particularly, to a memory device in which an additional charge storage capacitor need not be formed.

BACKGROUND ART

In general, a memory device refers to a device capable of storing and retaining predetermined data and reading the data at a required time point. An example of the memory device may be a dynamic random access memory (DRAM) device. A plurality of unit cells, each unit cell including one transistor and one capacitor, are integrated in the DRAM. That is, I-bit data is stored depending on whether or not charges are charged in the capacitor of the unit cell.

In recent years, research has been conducted on a technique of storing a larger amount of data by integrating many unit cells on the same area to ensure price competitiveness. In order to integrate a larger number of unit cells on the same area, the integration areas (i.e., sizes) of a transistor and a capacitor constituting a unit cell should be reduced. However, the areas of the transistor and the capacitor cannot be infinitely reduced.

A reduction in the area of the capacitor leads to a reduction in capacitance. Thus, the height of the capacitor should be increased to maintain the constant area of the capacitor. That is, for example, when the design rule of a DRAM is 60 nm, the capacitor has a height of about 1.6 µm. If the design rule of the DRAM is reduced to 40 nm, the height of the capacitor is increased to about 2.0 µm. When the height of the capacitor is increased, since an aspect ratio is increased during formation of holes required to manufacture a cylindrical capacitor, efficient patterning may be precluded. Also, since an interval between adjacent capacitors is reduced and the height of the capacitors is increased, the capacitors collapse and the adjacent capacitors may be electrically connected to one another. Accordingly, when the design rule of the DRAM is reduced to 40 nm or less, applying the cylindrical capacitor is difficult.

DISCLOSURE

Technical Object

Accordingly, as described above, a vast amount of research has lately been conducted on a type of device capable of replacing a capacitor of a DRAM device that causes many problems with a reduction in design rule. For example, a cap-less memory device (i.e., capacitorless memory device) in which a unit cell is manufactured using one transistor has been proposed. In the case of the capacitorless memory device, charges are charged in a silicon body of a transistor instead of a conventional capacitor.

In the capacitorless memory device, when a higher voltage is applied to a drain of the transistor than a gate thereof, impact ionization occurs due to a strong electrical field applied to the drain of the transistor, and electrons may be drained to the drain of the transistor, while holes may be accumulated in the silicon body (i.e., a lower portion of a silicon layer under the gate). The accumulation of the holes leads to a variation in threshold voltage, thus varying a drain current (that is, this is referred to as a kink effect). In this case, it is determined whether or not bit data is stored in a cell by reading a variation in the drain current.

However, in a conventional capacitorless memory device, since holes are accumulated in a silicon body in which source and drain regions are formed, the holes accumulated in the silicon body leak to the source and drain over time. Thus, the holes are retained for an insufficient time, thereby degrading data storage capability.

Accordingly, the present invention provides a capacitorless memory device in which a storage layer configured to prevent leakage of charges is formed in a portion of a body in which charges (i.e., holes or electrons) will be accumulated, so as to increase a charge retention time and improve data storage capability.

Technical Solution

According to an exemplary embodiment, a capacitorless memory device includes: a semiconductor substrate; an insulating layer disposed on the semiconductor substrate; a storage region disposed on a partial region of the insulating layer; a channel region disposed on the storage region to provide a valence band energy offset between the channel region and the storage region; a gate insulating layer and a gate electrode sequentially disposed on the channel region; and source and drain regions connected to the channel region and disposed at both sides of the gate electrode.

According to another exemplary embodiment, a capacitorless memory device includes: a semiconductor substrate; an insulating layer disposed on the semiconductor substrate; a storage region disposed on a partial region of the insulating layer; a channel region disposed on the storage region; a gate insulating layer and a gate electrode sequentially disposed on the channel region; and source and drain regions connected to the channel region and disposed at both sides of the gate electrode. The storage region and the channel region are formed of different material components.

The storage region may have different valence band energy from the channel region.

The storage region may store charges having a different polarity from charges forming a channel to be formed in the channel region.

A channel may be formed in the storage region, and the channel region may store charges having a different polarity from charges forming the channel to be formed in the storage region.

The storage region may have a smaller bandgap than the channel region and a lower electron affinity than the channel region.

The storage region may have a greater bandgap than the channel region and a higher electron affinity than the channel region.

The storage region may have a lower valence band energy than the channel region on the basis of a vacuum level.

The valence band energy offset between the storage region and the channel region may range from 0.1 to 1 eV.

A first layer and a second layer sequentially formed on the insulating layer may be included, and the gate insulating layer and the gate electrode may be formed on the second layer, the storage region may be formed in the first layer, and the channel region may be formed in the second layer.

The source and drain regions may be formed in the second layer at both sides of the gate electrode using an ion implantation process.

The first layer may include a germanium (Ge)-containing material, and the second layer may include a silicon (Si)-containing material.

The first layer may include a SiGe-based material, and the second layer may include a Si-based material.

Any one of the first and second layers is a strained layer.

A first layer formed on the partial region of the insulating layer and a second layer formed on top and lateral surfaces of the first layer disposed on the insulating layer are included, and the gate electrode may be formed on the second layer over the first layer. The storage region may be the first layer. The channel region may be formed in the second layer disposed over the first layer.

The source and drain regions may be formed by implanting impurity ions into the second layer at both sides of at least the gate electrode.

The first layer may include a Ge-containing material, and the second layer may include a Si-containing material.

The first layer may include a SiGe-based material, and the second layer may include a Si-based material.

Any one of the first and second layers may be a strained layer.

A first layer formed in an island or bar shape on the partial region of the insulating layer and a second layer formed on sidewalls and a top surface of the first layer are included, the gate insulating layer may surround the second layer, and the gate electrode may be formed on the gate insulating layer disposed on sidewalls of the second layer. The storage region may be formed in the first layer that overlaps the gate electrode. The channel region may be formed in the second layer that overlaps the gate electrode.

The source and drain regions may be formed in the second layer at both sides of at least the gate electrode using an ion implantation process.

The first layer may include a Ge-containing material, and the second layer may include a Si-containing material.

The first layer may include a SiGe-based material, and the second layer may include a Si-based material.

Any one of the first and second layers is a strained layer.

A first layer may be formed in an island or bar shape on a partial region of the insulating layer, a second layer may be formed on sidewalls and a top surface of the first layer, and the gate electrode may surround a portion of the second layer. The storage region may be formed in the first layer that overlaps the gate electrode. The channel region may be formed in the second layer that overlaps the gate electrode.

The source and drain regions may be formed in the second layer at both sides of at least the gate electrode using an ion implantation process.

The first layer may include a Ge-containing material, and the second layer may include a Si-containing material.

The first layer may include a SiGe-based material, and the second layer may include a Si-based material.

Any one of the first and second layers is a strained layer.

The storage region may include a Ge-containing material, and the channel region may include a Si-containing material.

The storage region may include a strained Ge-containing layer, and the channel region may include a Si-containing layer.

The storage region may include a relaxed Ge-containing layer, and the channel region may include a strained Si-containing layer.

The storage region may include a SiGe-based material, and the channel region may include a Si-based material.

The storage region may include a strained SiGe layer, and the channel region may include a Si layer.

The storage region may include a relaxed SiGe layer, and the channel region may include a strained Si layer.

The SiGe-based material may have a Ge concentration of about 10 to 95 at %.

The capacitorless memory device may further include: an interlayer insulating layer disposed on the entire structure including the gate electrode; and first and second interconnections connected respectively to the source and drain regions through portions of the interlayer insulating layer.

The amount of charges charged in the storage region may be controlled by adjusting source and drain voltage levels provided to the source and drain regions to enable multi-level drive operations.

A gate voltage and a bias voltage may be respectively applied to the gate electrode and the semiconductor substrate and have opposite polarities to each other.

A gate voltage may be applied to the gate electrode, source and drain voltages may be respectively to the source and drain regions, and a bias voltage may be applied to the semiconductor substrate. The gate voltage provided to the gate electrode and the bias voltage provided to the semiconductor substrate may be controlled to enable multi-bit drive operations.

A gate voltage having a different polarity from the bias voltage may be applied to the gate electrode to enable a first bit drive operation. A gate voltage and a back bias voltage having a different polarity from the first bit drive operation may be respectively applied to the gate electrode and the semiconductor substrate to enable a second bit drive operation.

During the second bit drive operation, the back bias voltage may have a higher absolute value than the gate voltage.

Advantageous Effect

As described above, according to the present invention, a storage region having different valence band energy from a channel region is disposed under the channel region so that charges can be trapped in the storage region. Thus, a conventional capacitor used for charging charges may be omitted.

Also, according to the present invention, on the basis of a vacuum level, valence band energy is controlled to be lower in a storage region than in a channel region so that charges trapped in the storage region cannot be easily drained, thereby increasing a charge retention time to improve data storage capability.

Furthermore, according to the present invention, a charge retention time may be increased to improve the reliability of a capacitorless memory device.

In addition, according to the present invention, charges are trapped in a storage region, thereby reducing dependence on a back bias.

Moreover, according to the present invention, a multi-level cell may be embodied by controlling a voltage applied to a device, and a plurality of bits may be embodied in a single cell.

Figure 1:
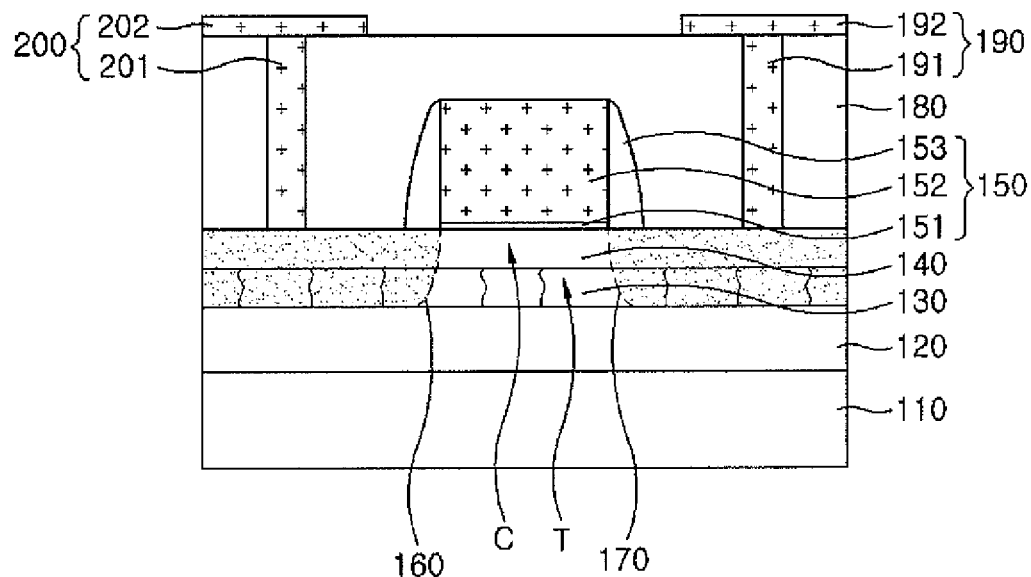
FIG. 1 is a cross-sectional view of a capacitorless memory device according to an exemplary embodiment of the present invention.

| * Description of Major Symbol in the above Figures | |
|---|---|
| 110: Semiconductor substrate | 120: Insulating layer |
| 130: Storage layer | 140: Channel layer |
| 150: Gate electrode unit | 160: Source region |
| 170: Drain region | |

MODE FOR EMBODYING INVENTION

Hereinafter, exemplary embodiments of the present invention will be described in detail. However, the present invention is not limited to the exemplary embodiments disclosed below, but can be implemented in various types. Therefore, the present exemplary embodiments are provided for complete disclosure of the present invention and to fully inform the scope of the present invention to those ordinarily skilled in the art.

In the drawings, the widths or thicknesses of layers and regions are exaggerated for clarity. The drawings are generally described from the viewpoint of an observer. It will also be understood that when a layer is referred to as being "on" or "under" another layer or substrate, it can be directly on or directly under the other layer or substrate or intervening layers may also be present.

Figure 2:
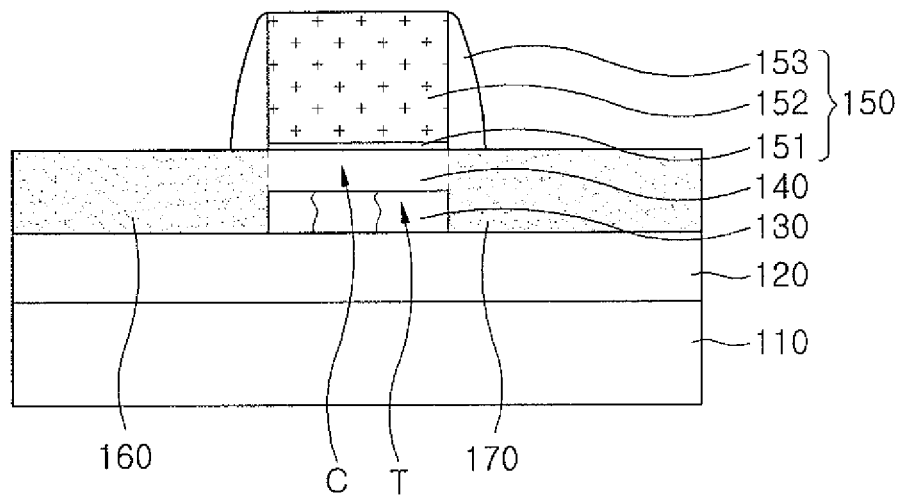
FIGS. 2 through 4 are cross-sectional views of capacitorless memory devices, according to first through third modified examples of FIG. 1.
Figure 3:
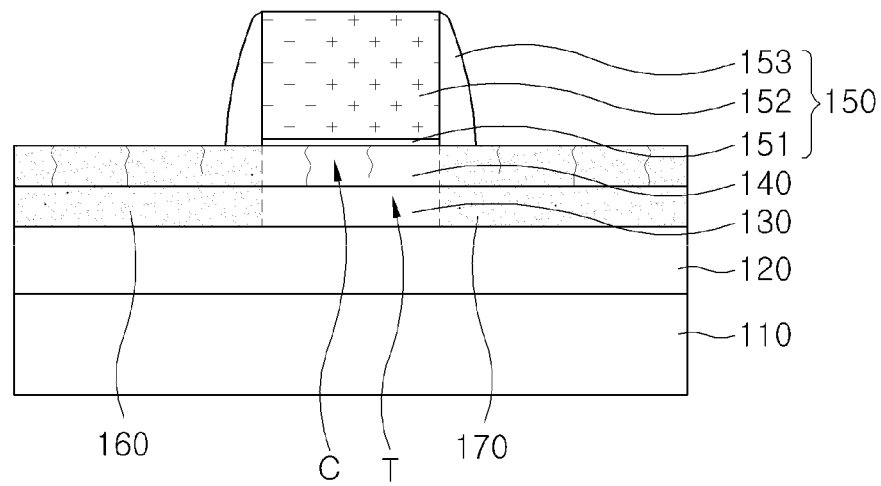
Figure 4:
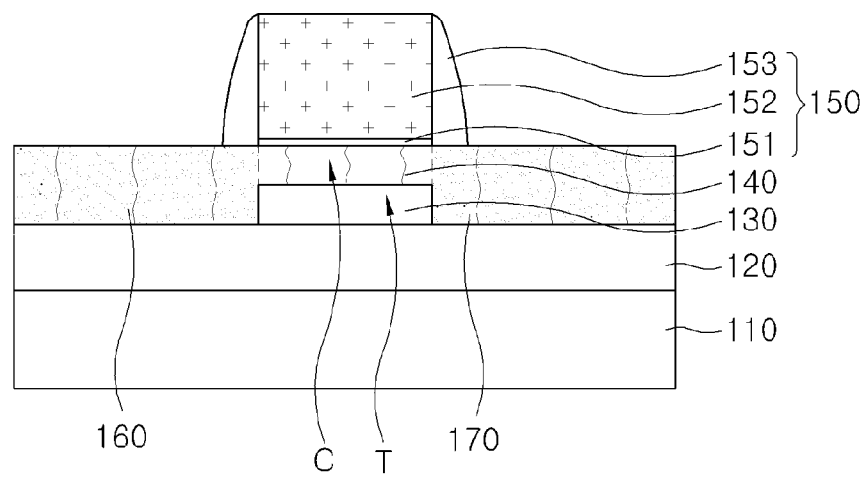
Figure 5:
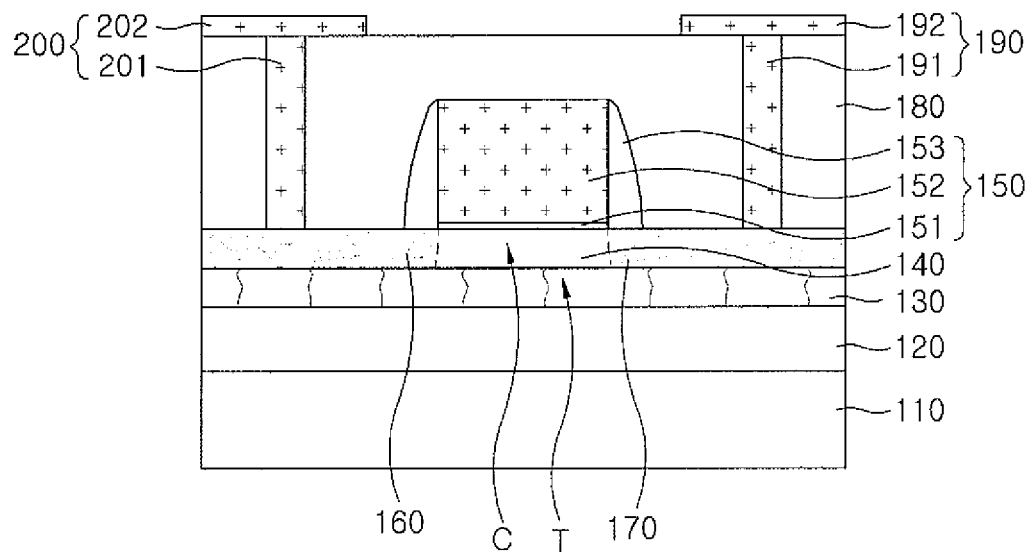
FIG. 5 is a cross-sectional view of a capacitorless memory device according to another example of an exemplary embodiment of the present invention.
Figure 6:
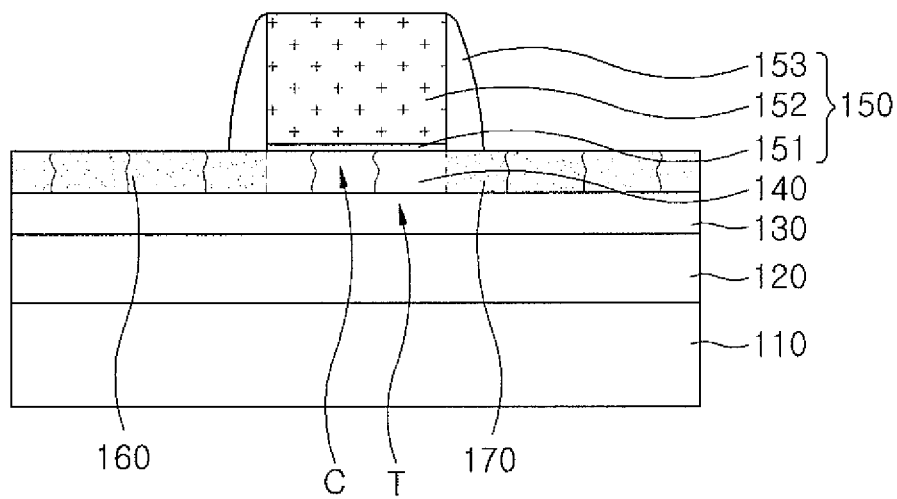
FIG. 6 is a cross-sectional view of a capacitorless memory device according to another example of the second modified example.

FIG. 1 is a cross-sectional view of a capacitorless memory device according to an exemplary embodiment of the present invention, FIGS. 2 through 4 are cross-sectional views of the capacitorless memory device of FIG. 1, according to first through third modified examples, FIG. 5 is a cross-sectional view of a capacitorless memory device according to another exemplary embodiment of the present invention, and FIG. 6 is a cross-sectional view of a capacitorless memory device according to another example of the second modified example.

Referring to FIG. 1, the capacitorless memory device according to the present embodiment may include a semiconductor substrate 110, an insulating layer 120 disposed on the semiconductor substrate 110, a first layer 130 and a second layer 140 sequentially stacked on the insulating layer 120, a gate electrode unit 150 disposed on a portion of the second layer 140, and source and drain regions 160 and 170 disposed respectively in the first and second layers 130 and 140 disposed at both sides of the gate electrode unit 150. A storage region T may be disposed within the first layer 130, while a channel region C may be disposed within the second layer 140.

Also, the capacitorless memory device according to the present embodiment may further include an interlayer insulating layer 180 disposed on the second layer 140 and the gate electrode unit 150 and first and second interconnection units 190 and 200 penetrating portions of the interlayer insulating layer 180 to be directly connected to the source and drain regions 160 and 170 disposed below the interlayer insulating layer 180. The first interconnection unit 200 may be connected to the source region 160 through a first contact plug 201, while the second interconnection unit 190 may be connected to the drain region 170 through a second contact plug 191. In this case, the first and second contact plugs 201 and 191 include contact holes formed by partially removing the interlayer insulating layer 180 to expose portions of the source and drain regions 160 and 170 disposed under the interlayer insulating layer 180 and a conductive material filling the contact holes. Thus, in the capacitorless memory device according to the present embodiment, an interconnection unit may be directly connected to the source and drain regions 160 and 170 without using a capacitor.

A single-element semiconductor substrate or a compound semiconductor substrate may be used as the semiconductor substrate 110. The semiconductor substrate 110 may be doped with predetermined impurity ions.

The insulating layer 120 may be a silicon oxide layer or a silicon nitride layer. In the present embodiment, a silicon oxide layer may be used as the insulating layer 120. In this case, the silicon oxide layer may be formed by partially oxidizing the semiconductor substrate 110. However, the present invention is not limited thereto and the insulating layer 120 may be formed using an ion implantation process.

The gate electrode unit 150 includes a gate insulating layer 151 disposed on a partial region of the second layer 140, a gate electrode 152 disposed on the gate insulating layer 151, and spacers 153 disposed on lateral surfaces of at least the gate electrode 152. In this case, the gate insulating layer 151 may be formed as a single layer or a multiple layer. In the present embodiment, a silicon oxide layer is used as the gate insulating layer 151. However, the present invention is not limited thereto and an insulating layer having a low dielectric constant may be used as the gate insulating layer 151. The gate electrode 152 may be formed as a single layer or a multiple layer. Although not shown in the present embodiment, the gate electrode 152 may include a polysilicon (poly-Si) layer doped with impurities (e.g., n-type or p-type impurities) and a metal layer disposed on the poly-Si layer. Also, a portion of the gate electrode 152 may protrude into the second layer 140 if required. The above-described gate electrode unit 150 may control a channel formed in the second layer 140 in response to a voltage applied through a word line (or gate line (not shown)). Thus, the gate electrode unit 150 is not limited to the above-described shape and may have various shapes configured to control the channel.

The source and drain regions 160 and 170 are formed using an ion implantation process in the first and second layers 130 and 140 at both sides of the gate electrode unit 150. Here, n-type or p-type ions may be used as the impurity ions. In the present embodiment, n-type impurity ions may be implanted to form the source and drain regions 160 and 170. Here, a lightly-doped-drain (LDD) ion implantation process may be performed during the ion implantation process. Of course, the present invention is not limited thereto, and the source and drain regions 160 and 170 may be formed by forming an additional junction layer (not shown) instead of forming regions corresponding to the source and drain regions 160 and 170 in the first and second layers 130 and 140 at both sides of the gate electrode unit 150. The source and drain regions 160 and 170 move electrons along the channel formed in the second layer 140 in response to an applied voltage. Thus, the source and drain regions 160 and 170 are not limited to the above-described shape and may have various shapes configured to move electrons in the channel.

In the present embodiment, the second layer 140 acts as a layer configured to prevent transport of charges (i.e., holes of the present embodiment) stored in the storage region T using a valence band energy offset between the first and second layers 130 and 140, and the channel is formed in a partial region of the second layer 140. A portion of the second layer 140 disposed under the gate electrode unit 150 between the source and drain regions 160 and 170 functions as the channel region C.

In the present embodiment, a portion of the first layer 130 acts as a charge storage space using a valence band energy offset between the first layer 130 and the second layer 140 disposed thereon. A portion of the first layer 130 disposed between the source and drain regions 160 and 170 under the second layer 140 disposed below the gate electrode unit 150 functions as the storage region T in which charges are stored. That is, the portion of the first layer 130 disposed under the channel region C acts as the storage region T.

As described above, an energy barrier is formed due to a valence band energy offset between the first and second layers 130 and 140. Thus, charges stored in the first layer 130 are not easily leaked or lost due to the energy barrier. In other words, a time for which charges are retained in the first layer 130 may be increased. In this case, it is effective that the first layer 130 has a lower valence band energy than the second layer 140 on the basis of a vacuum level.

The valence band energy offset between the first layer 130 and the second layer 140 may preferably range from 0.1 to 1 eV. When the valence band energy offset is less than 0.1 eV, the energy barrier between the first and second layers 130 and 140 may be low so that a leakage of charges cannot be effectively prevented. Thus, it is effective that the valence band energy offset is greater than or equal to 0.1 eV. Also, when the valence band energy offset is more than 1 eV, a voltage required for charging charges is increased due to an excessively great energy barrier.

For example, a case where a Si layer is used as the second layer 140 and a Ge layer is used as the first layer 130 will be examined. Here, on the basis of a vacuum level, Si has an energy bandgap of about 1.1 eV and an electron affinity of about 4.05 eV, while Ge has an energy bandgap of about 0.65 eV and an electron affinity of about 3.9 eV. In this case, when the Si layer and the Ge layer are bonded with each other, a valence band energy offset of about 0.374 eV occurs between the Si and Ge layers due to differences in energy bandgap and electron affinity between the Si and Ge layers. Owing to the valence band energy offset, a well barrier is formed between the Si and Ge layers, and charges are trapped by the well barrier.

Accordingly, it is effective that the second and first layers 140 and 130 are formed using materials having different energy bandgaps and electron affinities. On the basis of a vacuum level, it is further effective that the first layer 130 has a smaller energy bandgap and a lower electron affinity than the second layer 140.

Herein, since there is a great difference in lattice constant between Si and Ge, it may be difficult to sequentially grow the Si and Ge without crystal defects. SiGe has a lower energy bandgap and electron affinity than Si and exhibits good bonding characteristics at an interface between the SiGe and the Si. Thus, a SiGe layer used as the first layer 130 has excellent characteristics. Also, the SiGe layer 130 may be easily controlled to have desired characteristics according to Ge content.

It is described above that electrons are moved within the channel formed in the second layer 140 and holes are used as charges accumulated in the first layer 130. However, the present invention is not limited thereto, and holes may be moved within the channel formed in the second layer 140 and electrons may be used as the charges accumulated in the first layer 130 using an electron affinity offset between the first and second layers 130 and 140. In this case, an energy bandgap and an electron affinity may be opposite from the above description. Specifically, the second layer 140 may have lower energy bandgap and electron affinity than energy bandgap and electron affinity of the first layer 130 on the basis of a vacuum level, respectively.

In the present embodiment, a Si layer is used as the second layer 140, and a SiGe layer is used as the first layer 130. In the present embodiment, a strained SiGe layer is preferably used as the first layer 130. To this end, in the present embodiment, a first Si substrate is prepared, and a strained SiGe layer is, for example, epitaxially formed on the first Si substrate. Thereafter, a second Si substrate having an oxide layer formed on a surface thereof is prepared. Afterwards, the SiGe layer of the first Si substrate is bonded with the oxide layer of the second Si substrate. Subsequently, a portion of the first Si substrate disposed on the SiGe layer is cleaved. Thus, a modified SOI material in which an insulating layer, a strained SiGe layer, and a Si layer are sequentially stacked may be manufactured.

As described above, the capacitorless memory device having the first layer 130 configured to store charges therein using a valence band energy offset between the first and second layers 130 and 140 is not limited to the above construction and may be variously changed.

Specifically, in the first modified example shown in FIG. 2, the capacitorless memory device includes a first layer 130 formed in an island or line shape on a portion of an insulating layer 120, a second layer 140 disposed on the first layer 130, a gate electrode unit 150 disposed on the second layer 140, and source and drain regions 160 and 170 formed in second layers 140 at both sides of the gate electrode unit. When the first layer 130 is formed in the above-described shape, the entire first layer 130 may be a storage region T, and a channel region C may be formed between the source and drain regions 160 and 170 within the second layer 140.

In this case, the second layer 140 and the source and drain regions 160 and 170 are formed using the same material layer, and it is effective that the first layer 130 is a material layer having a lower valence band energy than the second layer 140 and the source and drain regions 160 and 170 on the basis of a vacuum level. Thus, holes are confined inside the first layer 130. In the present modified example, a Si layer is used as the second layer 140, and a strained SiGe layer is used as the first layer 130. Thus, at least three sides of the first layer 130 may be surrounded with a Si layer, thus further enhancing hole retention characteristics, To manufacture the above-described structure, as in the previous embodiment, a material obtained by sequentially stacking the insulating layer 120, a strained SiGe layer, and a Si layer on the semiconductor substrate 110 is prepared. Thereafter, the Si layer and the SiGe layer are removed by an etching process using a mask except a region where the gate electrode unit 150 will be formed. As a result, the SiGe layer and the Si layer are left on a region of the insulating layer 120 where the gate electrode unit 150 will be formed. In this case, the Si layer on the SiGe layer may be removed if required. However, after the insulating layer 120 and the strained SiGe layer are stacked on the semiconductor substrate 110, it is possible that the strained SiGe layer is removed using an etching process except a region where the gate electrode unit 150 will be formed.

Subsequently, a Si layer is grown on the insulating layer 120 on which the strained SiGe layer is patterned. Thus, the Si layer may be formed to cover the strained SiGe layer. Thereafter, a gate electrode unit 150 aligned to the strained SiGe layer which is patterned is formed on the Si layer. Also, impurity ions are implanted into the Si layer at both sides of the gate electrode unit 150, thereby forming source and drain regions 160 and 170.

However, the present invention is not limited thereto and a semiconductor substrate 110 on which the insulating layer 120 and the Si layer are stacked may be prepared. Thereafter, a region of the Si layer on which the gate electrode unit 150 is to be formed is removed. A SiGe layer is formed on a region of the insulating layer 120 from which the Si layer is removed, and a Si layer is formed on the SiGe layer. In this case, in order to form the SiGe layer on the insulating layer 120, the SiGe layer may be selectively deposited using an additional seed layer, or the remaining region of the Si layer may be coated with a mask and the SiGe layer may be selectively deposited only on the corresponding region. Subsequently, the gate electrode unit 150 is formed on the Si layer formed on the strained SiGe layer, and impurity ions are implanted into the Si layer at both sides of the gate electrode unit 150, thereby forming the source and drain regions 160 and 170.

In the above-described examples, the strained SiGe layer may be a compressively strained SiGe layer.

Also, as in the second modified example shown in FIG. 3, a relaxed SiGe layer may be used as the first layer 130, and a strained Si layer may be used as the second layer 140.

To this end, a first Si substrate on which a graded SiGe layer and a buffer SiGe layer are formed is prepared. Subsequently, a second Si substrate having the surface on which an insulating layer is formed is prepared. Thereafter, the buffer SiGe layer of the first Si substrate is bonded with the insulating layer of the second Si substrate, and the bonded structure is cleaved on the basis of a portion of the buffer SiGe layer, thereby separating the first Si substrate from the second Si substrate. Thus, an insulating layer 120 and a buffer SiGe layer (i.e., first layer 130) are formed on a semiconductor substrate 110. Afterwards, a strained Si layer (i.e., second layer 140) is, for example, epitaxially formed on the buffer SiGe layer. A gate electrode unit 150 is formed on the strained Si layer, and impurity ions are implanted into the strained Si layer and the buffer SiGe layer at both sides of the gate electrode unit 150, thereby forming source and drain regions 160 and 170. Here, a channel region C may be formed in a region of the second layer 140 between the source and drain regions 160 and 170, and a storage region T may be formed in the first layer 130 under the channel region C.

However, the present invention is not limited thereto, and a semiconductor substrate 110 on which an insulating layer 120 and an upper Si layer are formed may be prepared. Thereafter, a strained SiGe layer is formed on the upper Si layer. Afterwards, the strained SiGe layer is changed into a relaxed SiGe layer and the upper Si layer is oxidized using an oxidation process, thereby forming the insulating layer 120. Subsequently, an oxide layer formed on the SiGe layer is removed. Subsequently, a strained Si layer may be formed on the exposed SiGe layer.

Furthermore, as in the third modified example shown in FIG. 4, a first layer 130 is formed in an island or line shape, and a second layer 140 is formed on the first layer 130. In this case, a SiGe layer is used as the first layer 130, and the second layer 140 disposed on at least the first layer 130 is formed as a strained Si layer. To this end, manufacturing techniques described above in the second or third modified examples may be introduced. Due to the use of the strained Si layer, the mobility of electrons in the second layer 140 may be increased, thus further increasing a memory margin and a charge retention time.

In the above-described examples, the strained Si layer may be a tensile-strained Si layer.

Also, the present invention is not limited to the above-described embodiments and second modified example, and the source and drain regions 160 and 170 may be formed within the second layer 140. That is, according to another example of the embodiment as shown in FIG. 5, an ion implantation process was performed only in the second layer 140 at both sides of the gate electrode unit 150 so that source and drain regions 160 and 170 could be formed in the second layer 140. Furthermore, according to another example of the second modified example as shown in FIG. 6, source and drain regions 160 and 170 were formed in the second layer 140 at both sides of a gate electrode unit 150. Thus, leakage of charges due to the source and drain regions 160 and 170 may be prevented.

Of course, the present embodiment and modified examples mainly describe that a Si layer and a SiGe layer are used as the second layer 140 and the first layer 130, respectively. The second layer 140 may be formed of a Si-containing material, and the first layer 130 may be formed of a Ge-containing material. However, the present invention is not limited thereto, and various materials having differences in electron affinity, energy bandgap, and valence band energy may be selected as described above.

Operation of the capacitorless memory device having the above-described structure will now be described.

Figure 7:
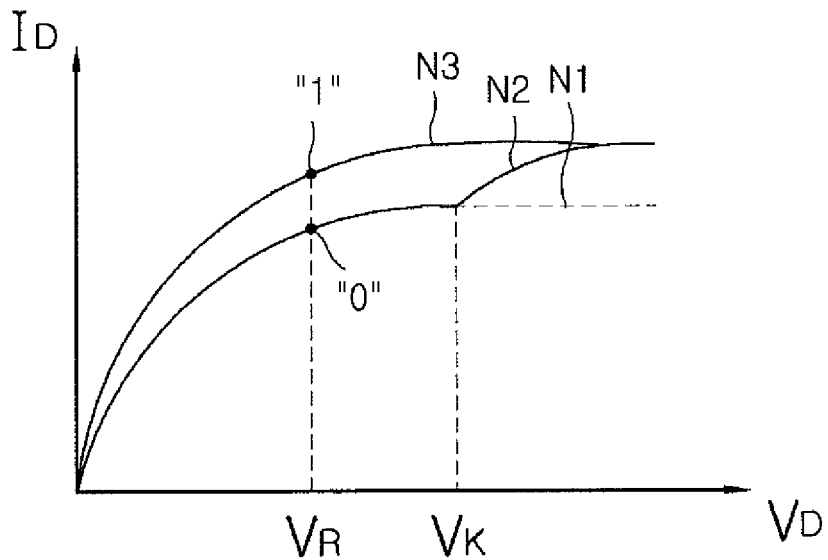
FIG. 7 is a conceptual diagram illustrating operations of a capacitorless memory device according to an exemplary embodiment of the present invention.
Figure 8:
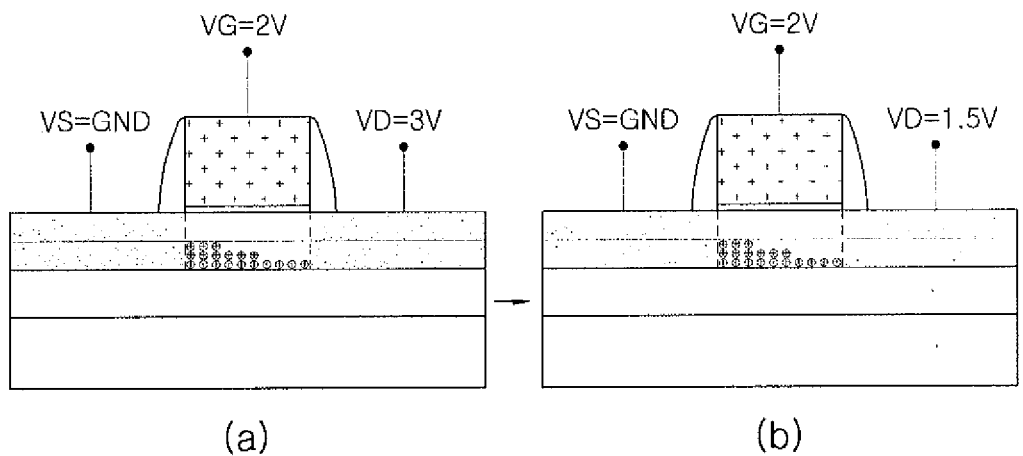
FIGS. 8 and 9 are conceptual cross-sectional views illustrating operations of a capacitorless memory device according to an exemplary embodiment of the present invention.
Figure 9:
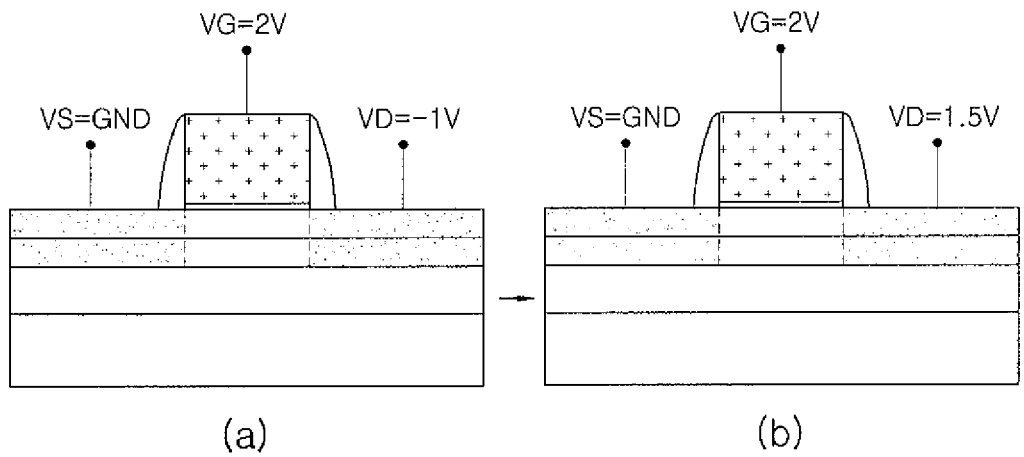

FIG. 7 is a conceptual diagram illustrating operation of a capacitorless memory device according to an exemplary embodiment of the present invention, and FIGS. 8 and 9 are conceptual cross-sectional views illustrating the operation of the capacitorless memory device of FIG. 7 according to an exemplary embodiment of the present invention.

Specifically, (a) of FIG. 8 is a conceptual cross-sectional view of a write operation, (b) of FIG. 8 is a conceptual cross-sectional view of a read operation of a device in which data "1" is written, (a) of FIG. 9 is a conceptual cross-sectional view of an erase operation, and (b) of FIG. 9 is a conceptual cross-sectional view of a read operation of a device in which data "0" (or erase data) is written.

In a unit cell of a typical memory device, as a voltage increase, current increases at a constant rate and is saturated as indicated by a curve N1 of FIG. 7. However, in the capacitorless memory device described in the present embodiment, when a voltage is increased as indicated by a curve N2 of FIG. 7, a period for which the current is increased occurs again due to a kink effect. This is because charges (i.e., holes) are accumulated in the first layer 130 disposed under the channel region C. Also, when the charges are accumulated in the first layer 130 as described above, as indicated by a curve N3 of FIG. 7, even if the voltage is reduced, the flow of current becomes different from in an initial period. Accordingly, the flow of current is varied depending on whether or not the holes are accumulated in the first layer 130, and data written in the device is determined using a difference in the flow of current.

In this case, a write voltage equal to or higher than a voltage for causing a kink effect (or kink voltage) is provided to the drain region 170 in order to write data "1" in the device, while an erase voltage is provided to the drain region 170 in order to erase data "0" from the device. Also, a read voltage between the kink voltage and the erase voltage is applied to determine data written in the device.

For example, as shown in FIGS. 8 and 9, a case where a voltage of about 3 V is used as the write voltage, a voltage of about −1 V is used as the erase voltage, and a voltage of about 1.5 V is used as the read voltage will now be examined.

Initially, to enable a write operation, as shown in (a) of FIG. 8, a voltage of about 2 V was applied to the gate electrode unit 150, a ground voltage GND was provided to the source region 160, and a voltage of about 3 V was applied to the drain region 170. In this case, as shown in (a) of FIG. 8, holes accumulated in the first layer 130. Also, the holes accumulated in the first layer 130 were trapped in the first layer 130 due to an energy offset between the first and second layers 130 and 140. Subsequently, to enable an erase operation, as shown in (a) of FIG. 9, a voltage of about 2 V was applied to the gate electrode unit 150, the ground voltage GND was provided to the source region 160, and a voltage of about −1 V was applied to the drain region 170. In this case, as shown in (a) of FIG. 9, holes did not accumulate in the first layer 130.

Furthermore, to enable a read operation, as shown in (b) of FIG. 8 and (b) of FIG. 9, a voltage of about 2 V was applied to the gate electrode unit 150, a ground voltage GND was provided to the source region 160, and a voltage of about 1.5 V was applied to the drain region 170. In this case, as shown in (b) of FIG. 8, when holes were trapped in the first layer 130 (i.e., when data "1" was written), current in a state where data "1" shown in FIG. 7 was written was flowed. Conversely, as shown in (b) of FIG. 9, when holes were not trapped in the first layer 130 (i.e., when data "0" was written), current in a state where data "0" shown in FIG. 7 was written was flowed. As described above, this is because when holes are trapped in the first layer 130, a threshold voltage of the device is varied to allow the flow of a larger current.

As described above, the holes accumulated in the first layer 130 are trapped due to a valence band energy offset between the first and second layers 130 and 140. Thus, a hole retention time in the first layer 130 may be increased more than in a conventional case where the first layer 130 is not formed. Also, the first layer 130 may be applicable to both a full-depletion structure and a partial-depletion structure. Furthermore, in the present embodiment, a hole retention time may be further increased by applying a back bias to a semiconductor substrate of the device. That is, the holes may be captured due to the applied back-bias, and thus a hole retention time in the first layer 130 can be increased. Also, it is possible to apply a lower back-bias voltage than a conventional full-depletion structure without the first layer 130.

In addition, the capacitorless memory device according to the present embodiment is capable of multi-level drive operations in response to voltages applied to the source and drain regions 160 and 170.

Figure 10:
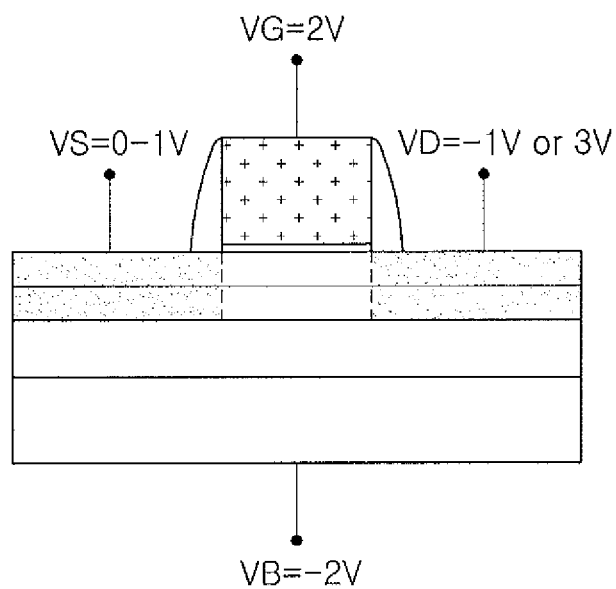
FIG. 10 is a conceptual cross-sectional view illustrating a multi-level drive operation of a capacitorless memory device according to an exemplary embodiment of the present invention.

FIG. 10 is a conceptual cross-sectional view for explaining a multi-level drive operation of a capacitorless memory device according to an exemplary embodiment of the present invention.

Referring to FIG. 10, when a gate voltage VG and a back-bias voltage VB applied to the gate electrode unit 150 are maintained constant, the capacitorless memory device may enable multi-level drive operations by controlling a source voltage VS applied to the source region 160 and a drain voltage VD applied to the drain region 170. In the present embodiment, since the amount of charges charged in the first layer 130 is at least 100 times larger than a conventional device using only a Si layer, the capacitorless memory device may enable multi-level drive operations by controlling the amount of charges charged in the first layer 130 using the source voltage VS (refer to FIG. 12).

For example, when a gate voltage VG of about 2 V is applied to the gate electrode unit 150, a ground voltage GND of about 0 V is provided to the source region 160, a drain voltage VD of about −1 V is applied to the drain region 170, and a back bias (VB) of about −2 V is applied, a drain current D0 having a first level is flowed. Also, when a gate voltage VG of about 2 V is applied to the gate electrode unit 150, a back bias VB of about −2 V is applied, a source voltage VS of about 0 V is provided to the source region 160, and a drain voltage VD of about 3 V is applied to the drain region 170, a drain current D1 having a second level different from the first level is flowed. Furthermore, when a gate voltage VG of about 2 V is applied to the gate electrode unit 150, a back bias VB of about −2 V is applied, a source voltage VS of about 0.5 V is provided to the source region 160, and a drain voltage VD of about 3 V is applied to the drain region 170, a drain current D2 having a third level different from the first and second levels is flowed. In addition, when a gate voltage VG of about 2 V is applied to the gate electrode unit 150, a back bias VB of about −2 V is applied, a source voltage VS of about 1 V is provided to the source region 160, and a drain voltage VD of about 3 V is applied to the drain region 170, a drain current D3 having a fourth level different from the first through third levels is flowed. That is, when a drain voltage is clamped and a source voltage is gradually increased from 0 V, the amount of charged charges may be reduced. When a drain voltage lower than a source voltage is applied, charges charged in a storage region may be erased. Thus, drain currents having different levels may be flowed according to variations of the source and drain voltages.

The above description is arranged in the following Table 1.

TABLE 1

| State | VG | VD | VS | VB |
|-------|----|----|----|----|
| D0 | 2 V | −1 V | 0 V | −2 V |
| D1 | 2 V | 3 V | 0 V | −2 V |
| D2 | 2 V | 3 V | 0.5 V | −2 V |
| D3 | 2 V | 3 V | 1 V | −2 V |

In the above description, voltages of 0, 0.5, and 1 V were used as the source voltage VS. However, the present invention is not limited thereto, and voltages having other levels may be used as the source voltage. Although voltages of −1 and 3 V were used as the drain voltage, a first drain voltage having a lower level than the source voltage or a voltage having a higher level than the source voltage may be used as the drain voltage.

Furthermore, the capacitorless memory device according to the present embodiment may be capable of embodying multi-bit operations.

Figure 11:
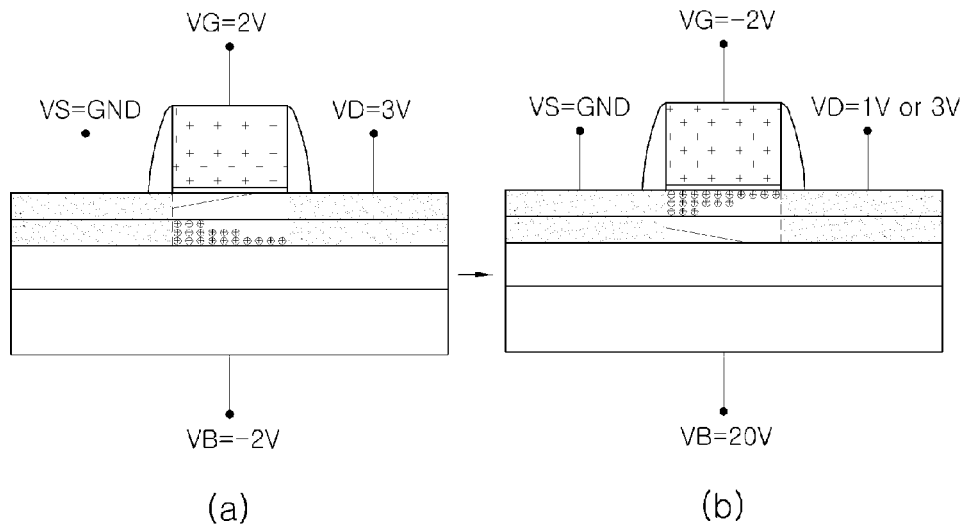
FIG. 11 is a conceptual cross-sectional view illustrating multi-level drive operations of a capacitorless memory device according to an exemplary embodiment of the present invention.

FIG. 11 is a conceptual cross-sectional view for explaining multi-bit operations of a capacitorless memory device according to an exemplary embodiment of the present invention.

Referring to FIG. 11, a first bit operation and a second bit operation may be performed by varying a gate voltage VG and a back-bias voltage VB. Also, during each of the first and second bit operations, an output state of the capacitorless memory device may be varied by varying a drain voltage VD.

For example, when a gate voltage VG of about 2 V is applied to a gate electrode unit 150, the ground voltage GND is provided as a source voltage VS to the source region 160, and a back bias of about −2 V is provided, each of voltages of about 3 V and −1 V is applied as a drain voltage VD to the drain region 170 to enable a 1-bit operation (refer to (a) of FIG. 11).

Also, when a gate voltage VG of about −2 V is applied to the gate electrode unit 150, a ground voltage GND is provided to the source region 160, and a back bias VB of about 20 V is provided, each of voltages of about 3 V and −1 V is applied as a drain voltage VD to the drain region 170 to enable a 2-bit operation (refer to (b) of FIG. 11).

That is, a voltage having a different polarity from the back bias voltage is applied as a gate voltage of the gate electrode unit to enable a 1-bit operation, and a gate voltage and a back bias voltage having a different polarity from the 1-bit operation are applied to the gate electrode unit and the semiconductor substrate, respectively, to perform a 2-bit operation. During the 2-bit operation, an absolute value of the back bias voltage is preferably greater than an absolute value of the gate voltage.

As described in the above-described embodiments and modified examples, in the capacitorless memory device according to the present invention, the first layer 130 in which charges (i.e., holes) are stored due to a valence band energy offset between a channel layer and the first layer 130 is formed under the second layer 140 disposed under at least the gate electrode unit 150. Thus, not only the amount of stored charges but also a charge retention time may be increased.

Figure 12:
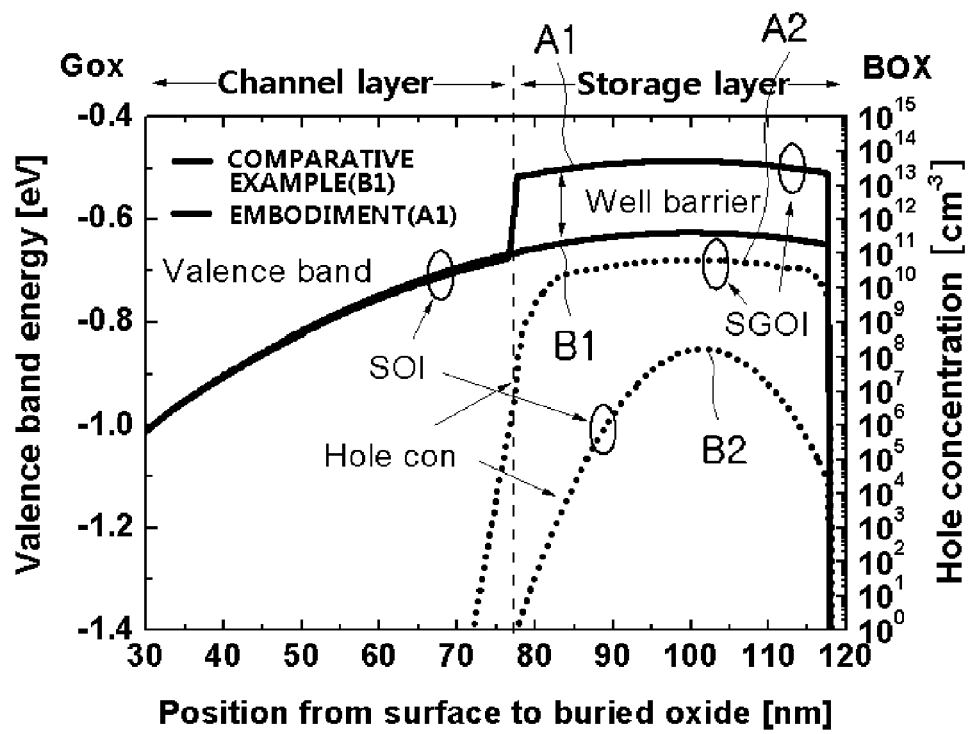
FIG. 12 is a graph showing a valence band energy offset between a channel layer and a storage layer and a hole concentration relative to the valence band energy offset according to an exemplary embodiment of the present invention.

FIG. 12 is a graph showing a valence band energy offset between a channel layer and a storage layer and a hole concentration relative to the valence band energy offset according to an exemplary embodiment of the present invention.

In FIG. 12, a curve Al shows a variation in valence band energy in a case where a Si layer is used as the second layer 140 and a SiGe layer is used as the first layer 130 according to the present embodiment, and a curve B1 shows a variation in valence band energy in a case where the second layer 140 and the first layer 130 are not divided from each other but formed as a single Si layer according to a comparative example. Also, in FIG. 12, a curve A2 shows the distribution of hole concentration in the case where the Si layer is used as the second layer 140 and the SiGe layer is used as the first layer 130, and a curve B2 shows the distribution of hole concentration in the single Si layer.

As shown in FIG. 12, an energy barrier was not formed in the case indicated by the curve B1. However, in the case indicated by the curve A1, it can be seen that an energy barrier was formed between a Si layer (i.e., second layer 140) and a SiGe layer (i.e., first layer 130) that have different energies. Thus, it can be seen that the hole concentration of a capacitorless memory device having both a Si layer and a SiGe layer (refer to the curve A2 of FIG. 12) is (at least about 100 times) higher than that of a capacitorless memory device having a single Si layer (refer to the curve B2 of FIG. 12). As described above, this is because an energy barrier is formed between the Si layer and the SiGe layer so that holes cannot be easily drained from the SiGe layer.

In the present embodiment, the magnitude of the energy barrier, which corresponds to a valence band energy offset between the second layer 140 and the first layer 130, may be controlled by adjusting the Ge concentration of the first layer 130.

Figure 13:
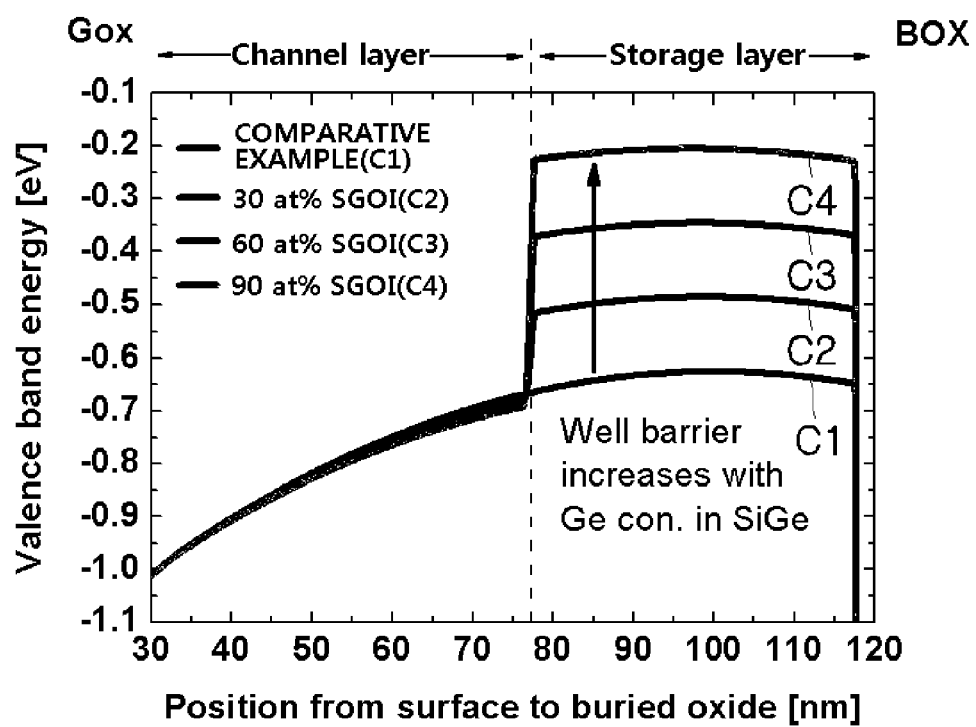
FIG. 13 is a graph showing a valence band energy offset relative to a Ge concentration of a storage layer according to an exemplary embodiment of the present invention.

FIG. 13 is a graph showing a valence band energy offset relative to a Ge concentration of a storage layer according to an exemplary embodiment of the present invention.

In FIG. 13, a curve C1 shows valence band energy in a case where a Si layer is wholly formed without forming a SiGe layer (i.e., the first layer 130) according to a comparative example. A curve C2 shows valence band energy in a case where the Ge concentration is 30 at %. A curve C3 shows valence band energy in a case where the Ge concentration is 60 at %. A curve C4 shows valence band energy in a case where the Ge concentration is 90 at %.

Referring to FIG. 13, it can be seen that as the Ge concentration of the first layer 130 increases, an energy offset between the first and second layers 130 and 140 may increase. As the energy offset between the first and second layers 130 and 140 increases, a larger amount of holes may be trapped, thereby improving the retention characteristics of a capacitorless memory device. Also, a memory margin may be improved, and a reduction in retention time due to gate-induced drain leakage (GIDL) may be inhibited. Here, the first layer 130 is preferably maintained at a Ge concentration of about 95 at % or lower. Furthermore, the first layer 130 may be maintained at a Ge concentration of about 90 at % or lower. Also, the first layer 130 is preferably maintained at a Ge concentration of about 10 at % or higher. When the Ge concentration is lower than 10 at %, a valence band energy offset between the first and second layers 130 and 140 is reduced so that the holes cannot be efficiently trapped. Furthermore, the first layer 130 may be maintained at a Ge concentration of about 20 at % or higher. Here, interface characteristics between the first and second layers 130 and 140 may be varied according to the Ge concentration. Accordingly, the first layer 130 may be maintained within the range of about 10 to 95 at %. However, a case where the Ge concentration of the first layer 130 is 100 at % is also possible.

Figure 14:
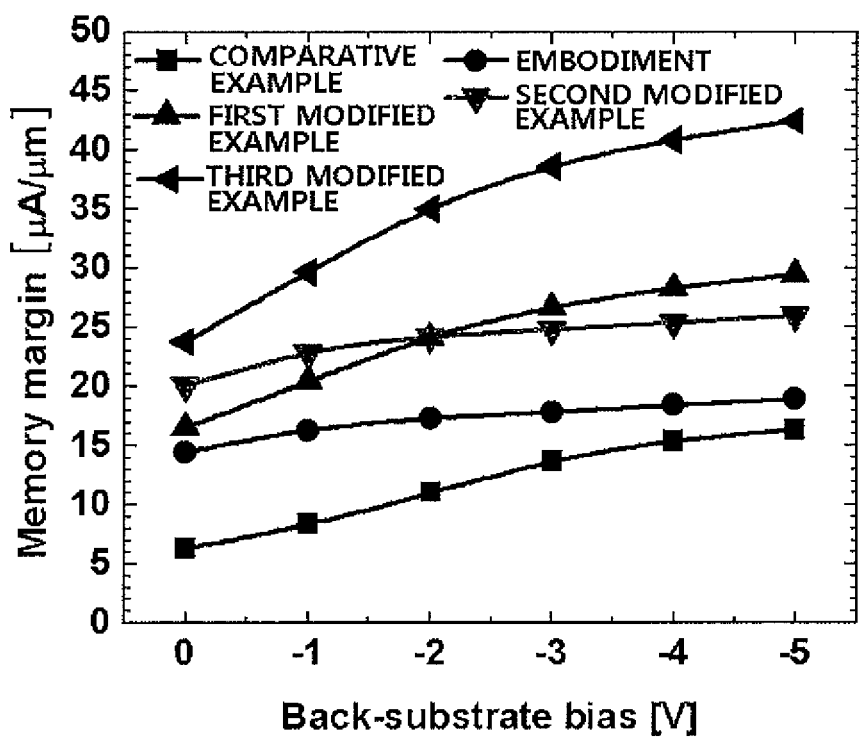
FIG. 14 is a graph for explaining memory margins according to an exemplary embodiment of the present invention and modified examples.
Figure 15:
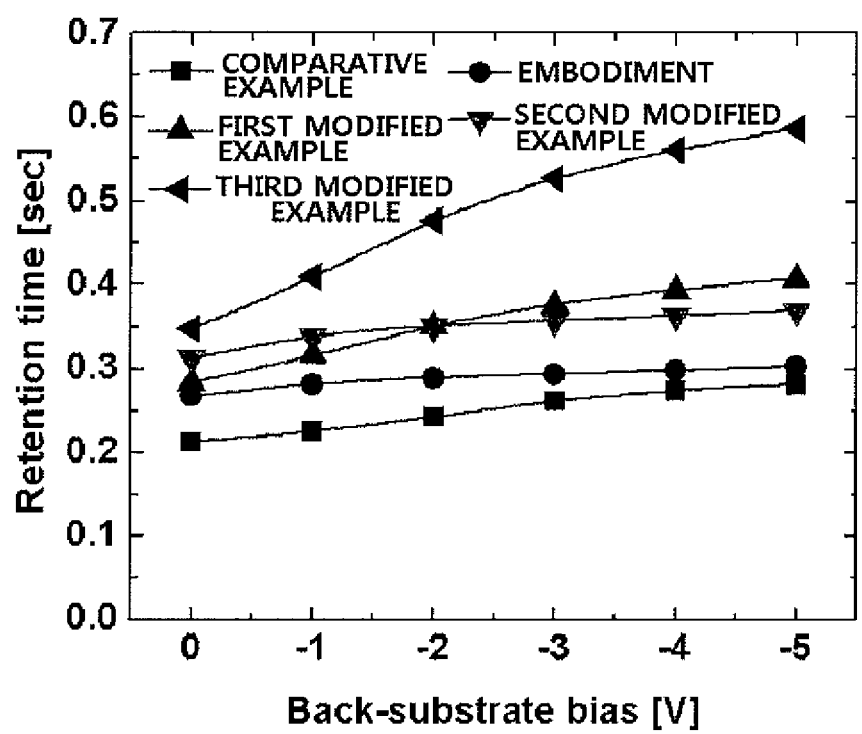
FIG. 15 are graphs for explaining hole retention times according to an exemplary embodiment of the present invention and modified examples.

FIG. 14 is a graph showing memory margins according to an exemplary embodiment and modified examples of the present invention, and FIG. 15 is a graph showing hole retention times according to the exemplary embodiment and modified examples of the present invention.

In FIGS. 14 and 15, a comparative example refers to a structure in which the first layer 130 is not formed. The embodiment and the first through third modified examples refer to structures described above with reference to FIGS. 1 through 4. Here, in the embodiment and the first through third modified examples, a memory margin and a hole retention time are measured by controlling the Ge concentration of the first layer 130 to be 50 at %. FIGS. 14 and 15 are graphs showing a memory margin and a hole retention time relative to a back bias voltage. In this case, a transistor has a width-to-length ratio (W/L) of 1/1 μm, which is measured at room temperature (about 25° C.). Referring to FIG. 14, it can be seen that in the embodiment and the first through third modified examples in which the first layer 130 is formed, a memory margin is increased more than the comparative example in which the first layer 130 is not formed. That is, it can be seen that the memory margin according to the third modified example is about 2.6 times larger than the memory margin according to the comparative example.

Referring to FIG. 15, it can be seen that in the embodiment and the first through third modified examples in which the first layer 130 is formed, a hole retention time is increased more than in the comparative example in which the first layer 130 is not formed. That is, it can be seen that the hole retention time (589 msec) of the third modified example is about 2 times longer than the hole retention time of the comparative example.

Referring to FIGS. 14 and 15, it can be seen that as a back bias voltage applied to a device increases in a negative direction, a memory margin and a cell retention time increase. In particular, in the embodiment and the second modified example, it can be seen that the memory margin and the cell retention time are not greatly dependent on the back bias voltage.

Thus, in the capacitorless memory device according to the present invention, holes are trapped within the first layer 130, thereby increasing a hole retention time and improving a memory margin.

Also, in the capacitorless memory device according to the present embodiment, a memory margin, a valence band energy offset, and a charge retention time may be varied according to the Ge concentration of the first layer 130.

Figure 16:
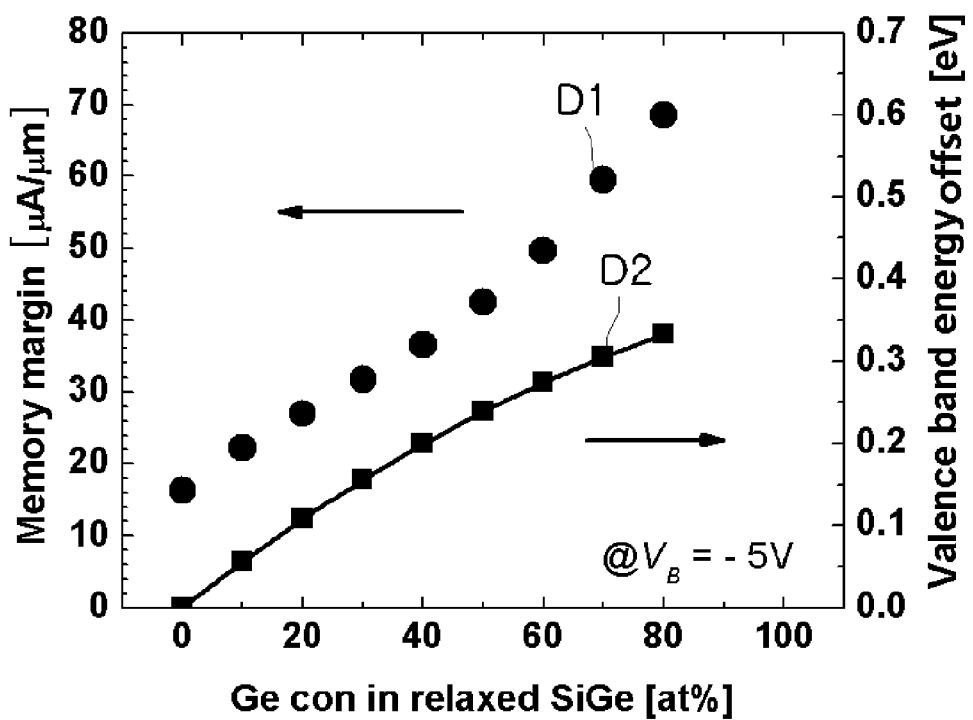
FIG. 16 is a graph showing a memory margin and a valence band energy offset relative to a Ge concentration of a storage layer according to a third modified example.
Figure 17:
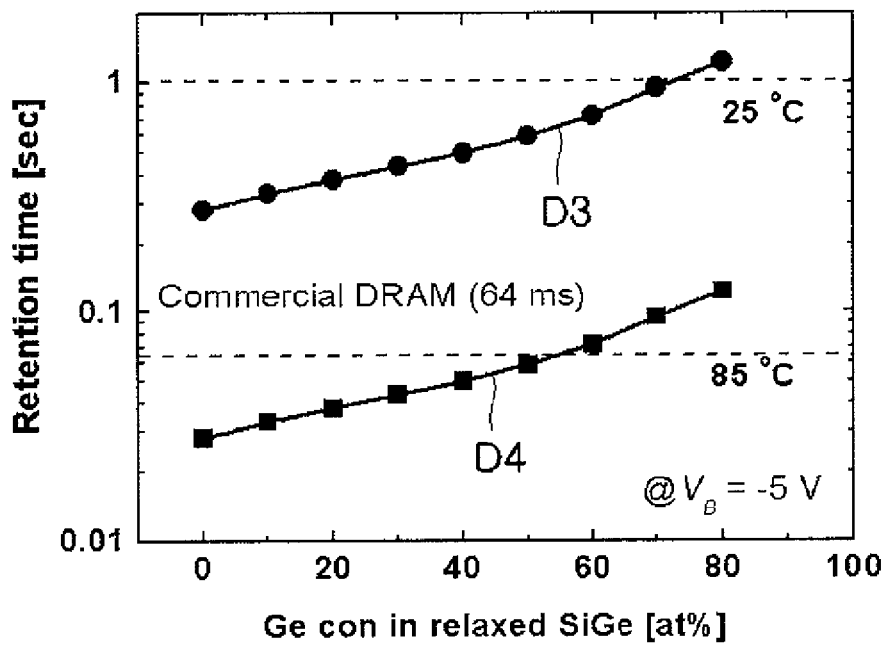
FIG. 17 is a graph showing a charge retention time relative to a Ge concentration of a storage layer according to a third modified example.

FIG. 16 is a graph showing a memory margin and a valence band energy offset relative to a Ge concentration of a storage layer according to the third modified example, and FIG. 17 is a graph showing a charge retention time relative to a Ge concentration of a storage layer according to the third modified example.

FIGS. 16 and 17 are graphs showing a memory margin and a charge retention time when a Si layer was formed to a thickness of about 50 nm, a SiGe layer was formed to a thickness of about 40 nm, and the Ge concentration of the SiGe layer was increased from 0 at % to 80 at %. When measuring the memory margin and the charge retention time, a back bias voltage of about −5 V was applied.

In FIG. 16, circular dots D1 indicate values of a memory margin relative to a Ge concentration. In view of the circular dots D1, it can be seen that the memory margin is increased with an increase in Ge concentration. Here, it can be seen that when the Ge concentration is increased to 80 at %, the memory margin is about four times larger than when the Ge concentration is 0 at %. Also, in FIG. 16, a curve D2 shows a valence band energy offset between a Si layer and a SiGe layer relative to Ge concentration. In view of the curve D2, it can be seen that the valence band energy offset between the Si layer and the SiGe layer increases with an increase in Ge concentration. In FIG. 17, a curve D3 shows a charge retention time relative to Ge concentration at a temperature of about 25° C., and a curve D4 shows a charge retention time relative to Ge concentration at a temperature of about 85° C. In view of the curves D3 and D4, it can be seen that a charge retention time increases with an increase in Ge concentration. Also, it can be seen that when the Ge concentration is about 70 at % at a temperature of about 25° C., the charge retention time is 1 second or more. That is, it can be seen that the charge retention time was about 285 msec at a Ge concentration of 0 at % and approximately quadrupled to 1228 msec at a Ge concentration of 80 at %.

The capacitorless memory device according to the present embodiment may reduce dependence on a back bias voltage at a read voltage.

Figure 18:
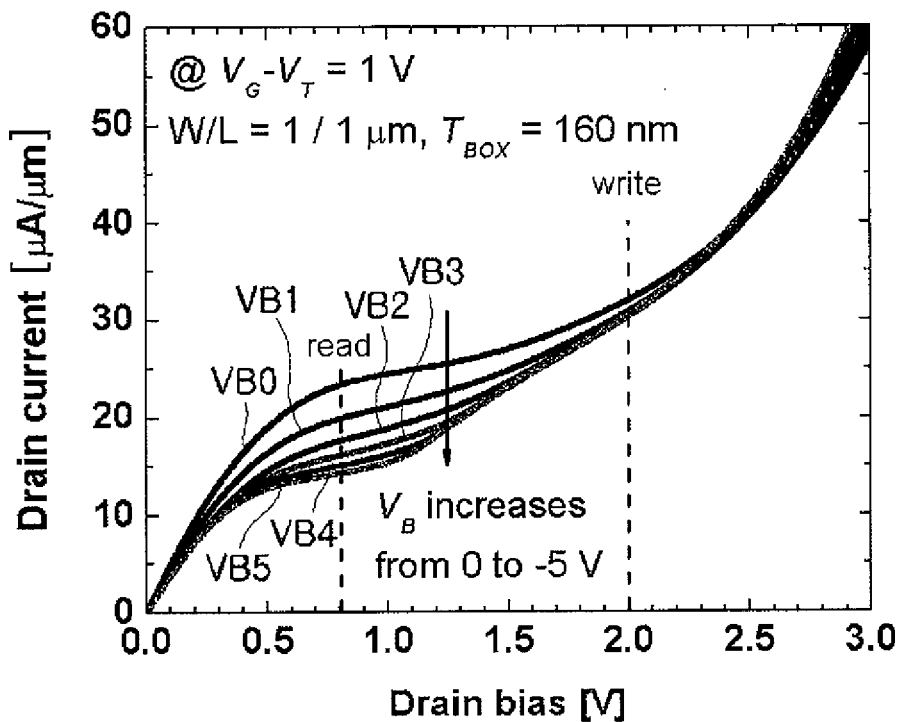
FIG. 18 is a graph showing a drain current relative to a drain voltage in a capacitorless memory device according to an exemplary embodiment of the present invention.
Figure 19:
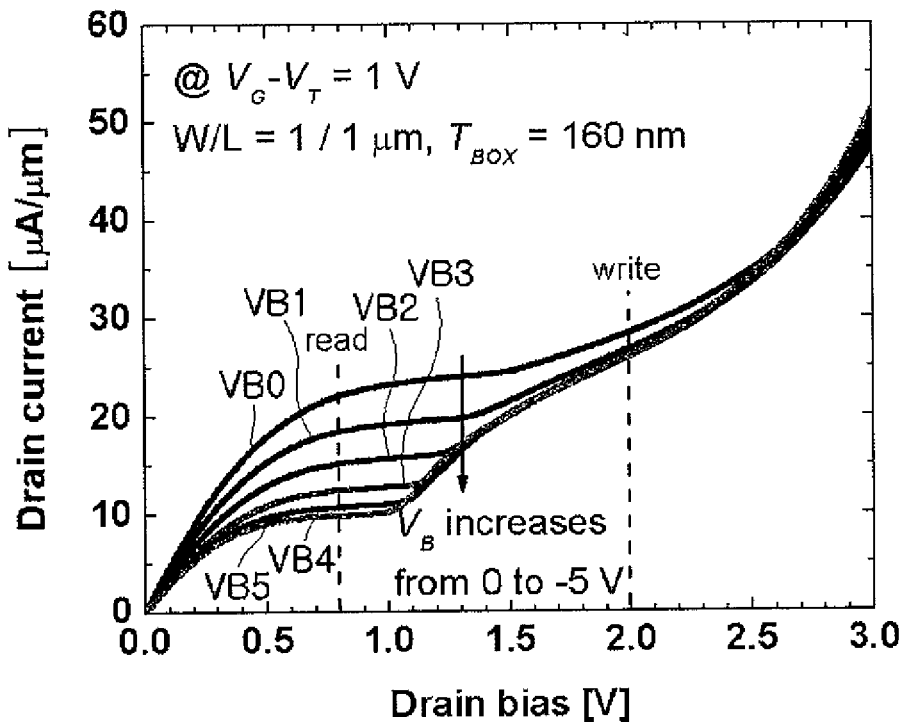
FIG. 19 is a graph showing a drain current relative to a drain voltage in a capacitorless memory device according to a comparative example.

FIG. 18 is a graph showing a drain current relative to a drain voltage in a capacitorless memory device according to an exemplary embodiment of the present invention, and FIG. 19 is a graph showing a drain current relative to a drain voltage in a comparative example.

FIGS. 18 and 19 are graphs showing variations in drain voltage-current measured with application of back bias voltages of about 0 V, −1 V, −2 V, −3 V, −4 V, and −5 V. In FIGS. 18 and 19, VB0 shows a case where a back bias voltage of 0 V was applied, VB1 shows a case where a back bias voltage of −1 V was applied, VB2 shows a case where a back bias voltage of −2 V was applied, VB3 shows a case where a back bias voltage of −3 V was applied, VB4 shows a case where a back bias voltage of −4 V was applied, and VB5 shows a case where a back bias voltage of −5 V was applied. FIG. 18 shows voltage-current curves of a capacitorless memory device according to an embodiment of the present invention in which the first layer 130 was controlled at a Ge concentration of about 30 at %, the second layer 140 was formed to a thickness of about 20 nm, and the first layer 130 was formed to a thickness of about 70 nm. FIG. 19 shows voltage-current curves of a capacitorless memory device according to a comparative example in which only a Si layer was formed to a thickness of about 90 nm without forming the first layer 130.

In the comparative example shown in FIG. 19, a variation in current with a back bias voltage at the same drain voltage was about 12 μA. In comparison, in the embodiment of the present invention as shown in FIG. 18, a variation in current with a back bias voltage at the same drain voltage was 9 μA, which was ¾ that of the comparative example. Thus, it can be seen that the capacitorless memory device according to the present embodiment was less dependent on the back bias voltage than in the comparative example.

In the capacitorless memory devices according to the second and third modified examples, a strained Si layer may be used as the second layer 140 disposed on the first layer 130, thereby increasing the electron mobility of the channel region C.

The structure of the capacitorless memory device according to the present embodiment is not limited to the above-described embodiment and first through third modified examples and may be variously changed.

FIGS. 20 through 23 are diagrams of capacitorless memory devices according to fourth through seventh examples.

Figure 20:
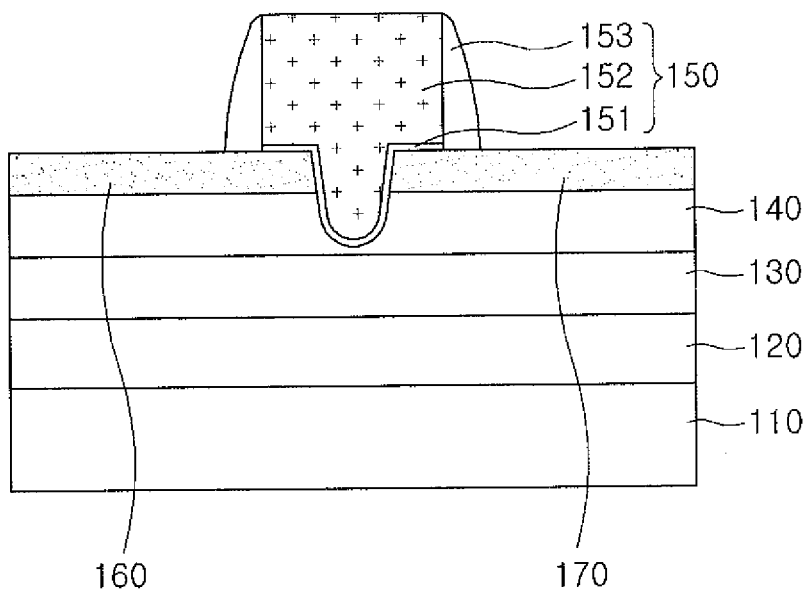
FIGS. 20 through 23 are diagrams of capacitorless memory devices according to fourth through seventh modified examples.

As shown in FIG. 20, the capacitorless memory device according to the fourth modified example includes an insulating layer 120, a first layer 130, and a second layer 140 sequentially stacked on a substrate 110. Also, a partial region of the second layer 140 is recessed, and a gate electrode unit 150 is formed on the recessed region. Furthermore, source and drain regions 160 and 170 are formed in an upper portion of both sides of the recessed region (i.e., at both sides of the gate electrode unit 150). Thus, a portion of the gate electrode unit 150 may protrude and extend into the second layer 140. Also, the source and drain regions 160 may be disposed in an upper portion of the second layer 140.

Figure 21:
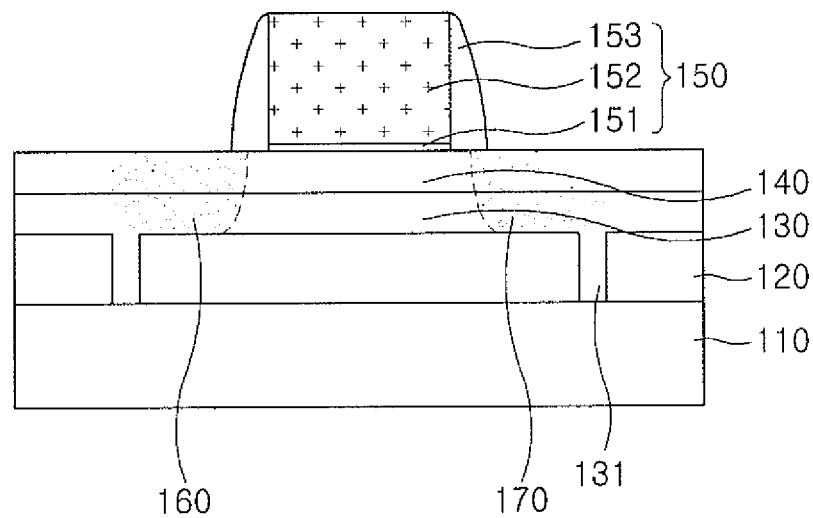

As shown in FIG. 21, the capacitorless memory device according to the fifth modified example further includes a connection layer 131 to connect the first layer 130 and the semiconductor substrate 110 by removing a portion of the insulating layer 120. The first layer 130 may be grown from the semiconductor substrate 110 through the connection layer 131, thereby forming the first layer 130 on the insulating layer 120. To this end, the insulating layer 120 is formed on the semiconductor substrate 110. Thereafter, the portion of the insulating layer 120 is etched, thereby forming a groove to expose a portion of the semiconductor substrate 110. Afterwards, the first layer 130 is formed using a deposition process. Specifically, the connection layer 131 is initially formed within the groove, and the first layer 130 is formed using a continuous deposition process. Thus, the first layer 130 containing SiGe may be formed on the insulating layer 120 without performing an additional bonding or cleavage process.

Figure 22:
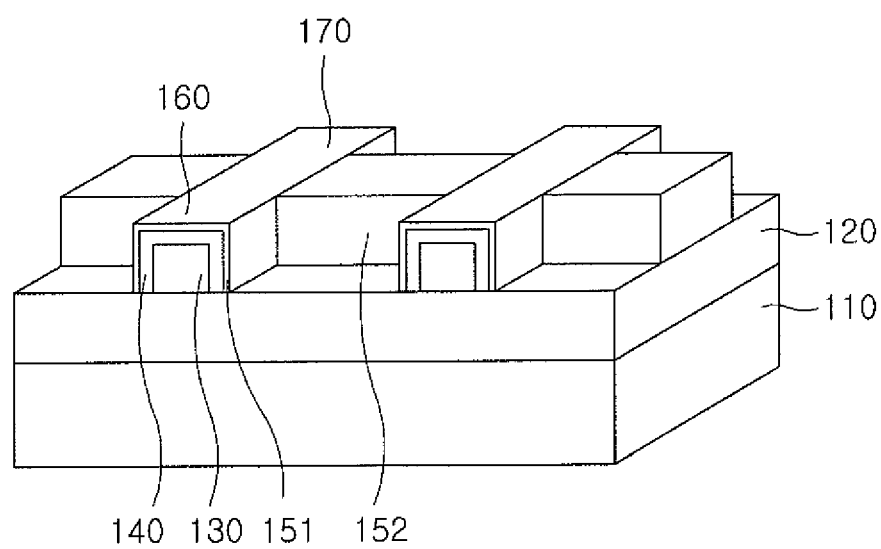

Furthermore, in the capacitorless memory device according to the sixth modified example as shown in FIG. 22, a bar- or island-shaped first layer 130 may be formed on a partial region of the insulating layer 120. Also, a second layer 140 is formed to surround at least three sides of the first layer 130, and a gate insulating layer 151 was formed to surround the second layer 140. Thereafter, a gate electrode 152 is formed on sidewalls of the second layer 140 to be in contact with the insulating layer 120 and the gate insulating layer 151. Subsequently, source and drain electrode layers 160 and 170 are formed using an ion implantation process in the second layer 140 and the first layer 130 at both sides of the gate electrode 152. Thus, the structure of the capacitorless memory device may be simplified, and the height of the capacitorless memory device may be reduced. In addition, the first layer 130 may be surrounded with the second layer 140, thereby enhancing the charge storage capability of the first layer 130.

Figure 23:
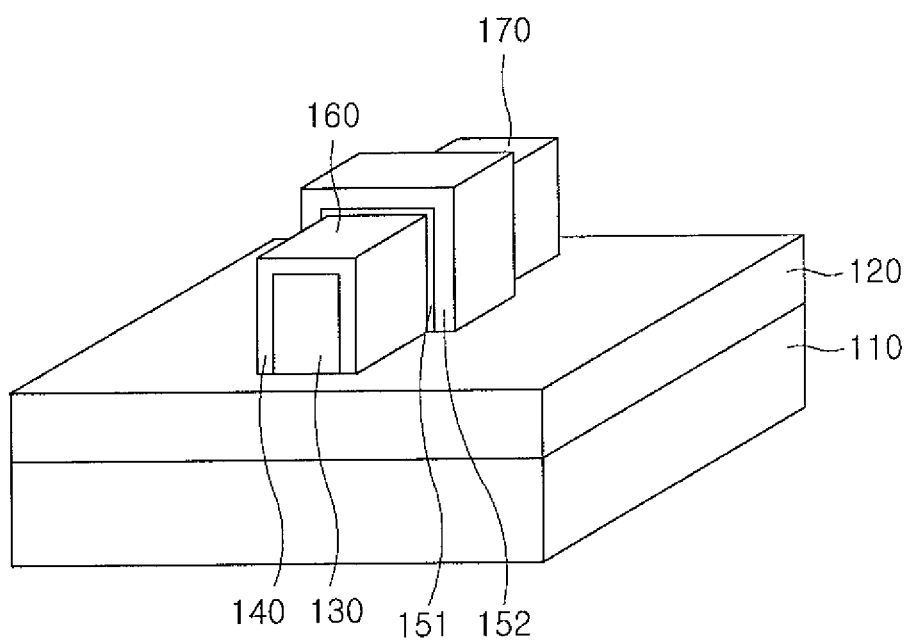

In the capacitorless memory device according to the seventh modified example as shown in FIG. 23, a bar- or island-shaped first layer 130 is formed on a partial region of the insulating layer 120, and a second layer 140 is formed to surround the first layer 130. A gate insulating layer 151 and a gate electrode 152 are sequentially formed on a partial region of the second layer to surround at least three sides of the second layer 140. Also, an ion implantation process is performed on the second layer 140 and the first layer 130 at both sides of the gate electrode 152, thereby forming source and drain regions 160 and 170. As described above, the gate electrode 152 is formed in such a shape as to surround the second layer 140, thereby increasing the length and sectional area of a channel.

While the invention has been shown and described with reference to m certain exemplary embodiments thereof, it will be understood by those skilled in the art that various changes in form and details may be made therein without departing from the spirit and scope of the invention as defined by the appended claims.

The invention claimed is:

1. A capacitorless memory device comprising:
a semiconductor substrate;
an insulating layer disposed on the semiconductor substrate;
a first layer formed in an island shape and disposed on a partial region of the insulating layer, wherein the first layer has a storage region;
a second layer formed on top and lateral surfaces of the first layer,
wherein the second layer includes a channel region disposed on the storage region to provide a valence band energy offset between the channel region and the storage region, and
wherein the second layer includes source and drain regions connected to both sides of the channel region; and
a gate insulating layer and a gate electrode sequentially disposed on the channel region,
wherein the storage region includes a strained SiGe-containing material, and the channel region includes an unstrained Si-containing material.

2. A capacitorless memory device comprising:
a semiconductor substrate;
an insulating layer disposed on the semiconductor substrate;
a first layer formed in an island shape and disposed on a partial region of the insulating layer, wherein the first layer has a storage region;
a second layer formed on top and lateral surfaces of the first layer,
wherein the second layer includes a channel region disposed on the storage region, and
wherein the second layer includes source and drain regions connected to both sides of the channel region; and
a gate insulating layer and a gate electrode sequentially disposed on the channel region,
wherein the storage region and the channel region are formed of different material components, and
wherein the storage region includes a strained SiGe-containing material, and the channel region includes an unstrained Si-containing material.

3. The device of claim 2, wherein there is a valence band energy offset between the storage region and the channel region.

4. The device of claim 3, wherein the valence band energy offset between the storage region and the channel region ranges from 0.1 to 1 eV.

5. The device of claim 3, wherein the storage region has a lower valence band energy than the channel region on the basis of a vacuum level.

6. The device of claim 2, wherein the storage region stores charges having a different polarity from charges forming a channel to be formed in the channel region.

7. The device of claim 2, wherein the storage region has a smaller bandgap than the channel region and a lower electron affinity than the channel region.

8. The device of claim 2, wherein the storage region has a greater bandgap than the channel region and a higher electron affinity than the channel region.

9. The device of claim 2, wherein the source and drain regions are formed in the second layer at both sides of the gate electrode using an ion implantation process.

10. The device of claim 2,
wherein the gate insulating layer surrounds the second layer,
wherein the gate electrode is formed on the gate insulating layer disposed on sidewalls of the second layer,
wherein the storage region is formed in the first layer that overlaps the gate electrode, and
wherein the channel region is formed in the second layer that overlaps the gate electrode.

11. The device of claim 2,
wherein the gate electrode surrounds a portion of the second layer,
wherein the storage region is formed in the first layer that overlaps the gate electrode, and
wherein the channel region is formed in the second layer that overlaps the gate electrode.

12. The device of claim 2, wherein the SiGe-containing material has a Ge concentration of about 10 to 95 atomic %.

13. The device of claim 2, wherein the amount of charges charged in the storage region is controlled by adjusting source and drain voltage levels provided to the source and drain regions to enable multi-level drive operations.

14. The device of claim 2, wherein a gate voltage is applied to the gate electrode, source and drain voltages are respectively applied to the source and drain regions, and a bias voltage is applied to the semiconductor substrate, and the gate voltage provided to the gate electrode and the bias voltage provided to the semiconductor substrate are controlled to enable multi-bit drive operations.

15. A capacitorless memory device, comprising:
- a first layer in an island shape, wherein the first layer has a storage region;
- a second layer placed on top and lateral surfaces of the first layer,
- wherein the second layer includes a channel region disposed on the storage region, and
- wherein the second layer includes source and drain regions connected to both sides of the channel region; and
- a gate insulating layer and a gate electrode sequentially disposed on the channel region,
- wherein the storage region and the channel region are formed of different material components, and
- wherein the storage region includes a strained SiGe-containing material, and the channel region includes an unstrained Si-containing material.

* * * * *